United States Patent
Tromp et al.

(10) Patent No.: US 11,098,759 B2
(45) Date of Patent: Aug. 24, 2021

(54) SUPPORT TABLE FOR A LITHOGRAPHIC APPARATUS, METHOD OF LOADING A SUBSTRATE, LITHOGRAPHIC APPARATUS AND DEVICE MANUFACTURING METHOD

(71) Applicant: ASML NETHERLANDS B.V., Veldhoven (NL)

(72) Inventors: Siegfried Alexander Tromp, Knegsel (NL); Antonie Hendrik Verweij, Dussen (NL); Abraham Alexander Soethoudt, Eindhoven (NL); Jan Pieter Van De Poel, Hendrik Ido Ambacht (NL); Mark Constant Johannes Baggen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/735,131

(22) Filed: Jan. 6, 2020

(65) Prior Publication Data

US 2020/0141445 A1    May 7, 2020

Related U.S. Application Data

(63) Continuation of application No. 15/513,086, filed as application No. PCT/EP2015/073112 on Oct. 7, 2015, now Pat. No. 10,527,092.

(30) Foreign Application Priority Data

Oct. 23, 2014  (EP) .................................... 14190079

(51) Int. Cl.
*H01L 21/683* (2006.01)
*G03F 7/20* (2006.01)
(Continued)

(52) U.S. Cl.
CPC ........ *F16C 32/0611* (2013.01); *F16C 29/025* (2013.01); *F16C 32/0607* (2013.01);
(Continued)

(58) Field of Classification Search
CPC ......... G03F 7/707–70791; H01L 21/67–68792
See application file for complete search history.

(56) References Cited

U.S. PATENT DOCUMENTS 6,257,564 B1   7/2001  Avneri
6,952,253 B2  10/2005  Lof et al.
(Continued)

FOREIGN PATENT DOCUMENTS

EP   1 420 298    5/2004
EP   2 267 535   12/2010
(Continued)

OTHER PUBLICATIONS

International Search Report and Written Opinion dated Jan. 27, 2016 in corresponding International Patent Application No. PCT/EP2015/073112.

(Continued)

*Primary Examiner* — Tyrone V Hall, Jr.
(74) *Attorney, Agent, or Firm* — Pillsbury Winthrop Shaw Pittman, LLP

(57) ABSTRACT

A support table for a lithographic apparatus, a method of loading a substrate, a lithographic apparatus and a method for manufacturing a device using a lithographic apparatus. In one arrangement, a support table is configured to support a substrate. The support table has a base surface. The base surface faces a surface of the substrate when the substrate is supported by the support table. One or more gas cushion members are provided above the base surface. Each of the gas cushion members includes a recess. The recess is shaped and configured such that a lowering of the substrate into a (Continued)

position on the support table at which the substrate is supported by the support table causes a localised build-up of pressure within the recess. The localized build-up of pressure provides a localised gas cushioning effect during the lowering of the substrate.

20 Claims, 7 Drawing Sheets

(51) Int. Cl.
    *F16C 32/06*      (2006.01)
    *F16C 29/02*      (2006.01)

(52) U.S. Cl.
    CPC ............... *G03F 7/20* (2013.01); *G03F 7/707* (2013.01); *G03F 7/708* (2013.01); *H01L 21/6831* (2013.01); *H01L 21/6833* (2013.01)

(56) References Cited

U.S. PATENT DOCUMENTS

| | | | |
|---|---|---|---|
| 7,027,132 | B2 | 4/2006 | Ottens et al. |
| 8,232,540 | B2 | 7/2012 | Ottens et al. |
| 8,616,598 | B2 | 12/2013 | Cadee et al. |
| 2001/0005595 | A1 | 6/2001 | Morita et al. |
| 2002/0036373 | A1 | 3/2002 | Kosakai |
| 2002/0159217 | A1 | 10/2002 | Tsuruta et al. |
| 2004/0012767 | A1 | 1/2004 | Van Elp |
| 2004/0207824 | A1 | 10/2004 | Lof et al. |
| 2005/0122503 | A1 | 6/2005 | Ottens et al. |
| 2005/0195382 | A1 | 9/2005 | Ottens et al. |
| 2006/0072085 | A1 | 4/2006 | Compen |
| 2006/0096972 | A1 | 5/2006 | Nakamura |
| 2006/0102849 | A1 | 5/2006 | Mertens |
| 2007/0103666 | A1 | 5/2007 | Ottens |
| 2007/0146665 | A1 | 6/2007 | Ottens et al. |
| 2007/0247779 | A1 | 10/2007 | Nakamura |
| 2008/0165330 | A1 | 7/2008 | Mizutani |
| 2008/0239275 | A1 | 10/2008 | Mizutani et al. |
| 2008/0316461 | A1* | 12/2008 | Compen ............. H01L 21/6838 355/73 |
| 2009/0233443 | A1 | 9/2009 | Sasaki |
| 2010/0045949 | A1 | 2/2010 | Nakano et al. |
| 2010/0259735 | A1 | 10/2010 | Eummelen et al. |
| 2011/0267592 | A1 | 11/2011 | Ottens et al. |
| 2011/0280703 | A1 | 11/2011 | Cadee et al. |
| 2013/0094005 | A1 | 4/2013 | Kunnen |
| 2013/0146758 | A1 | 6/2013 | Urban et al. |
| 2013/0301028 | A1 | 11/2013 | Albert |

FOREIGN PATENT DOCUMENTS

| | | |
|---|---|---|
| JP | 2004-140271 | 5/2004 |
| JP | 2005-142570 | 6/2005 |
| JP | 2006-175204 | 7/2006 |
| JP | 2007-180555 | 7/2007 |
| JP | 2010-530636 | 9/2010 |
| KR | 10-2010-0113043 | 10/2010 |
| KR | 10-2013-0061647 | 6/2013 |
| KR | 10-495739 | 3/2015 |
| WO | 2008/156366 | 12/2008 |

OTHER PUBLICATIONS

European Office Action issued in corresponding European Patent Application No. 15775219.2 dated Jun. 18, 2019.
Korean Notice of Allowance issued in corresponding Korean Patent Application No. 10-2017-7013878, dated Mar. 22, 2019.
First Office Action issued in corresponding Chinese Patent Application No. 201580057004.6 dated Feb. 26, 2018.
Notice of Reasons for Rejection issued in corresponding Japanese Patent Application No. 2017-514657 dated Apr. 9, 2018.
Korean Office Action dated Sep. 3, 2018 issued in corresponding Korean Patent Application No. 10-2017-7013878.

* cited by examiner

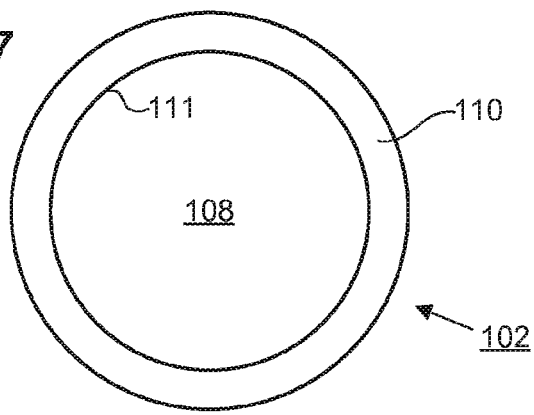
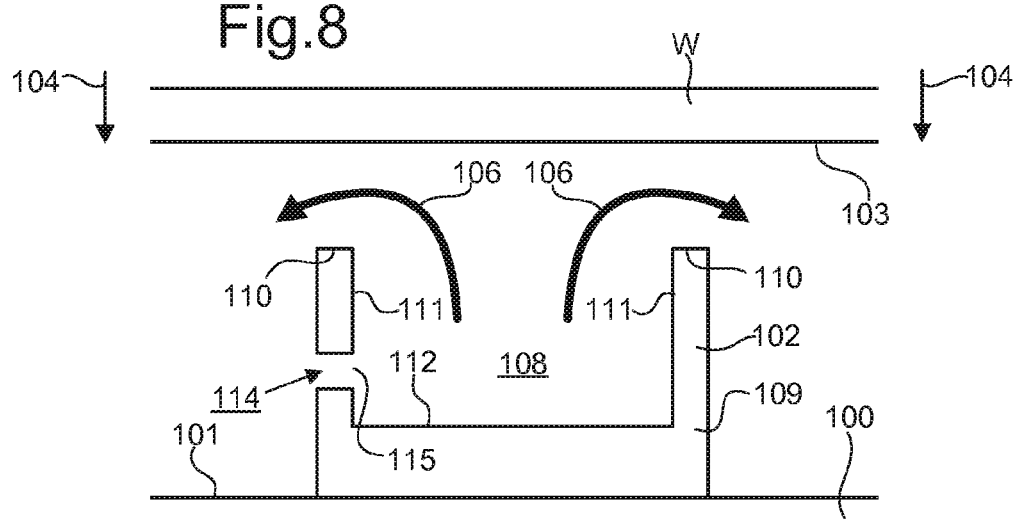
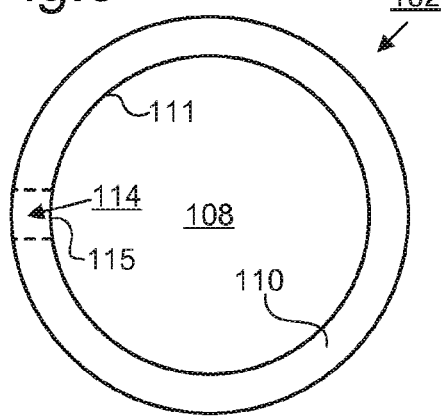
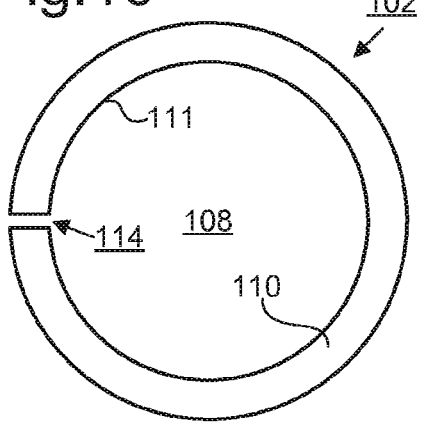

SUPPORT TABLE FOR A LITHOGRAPHIC APPARATUS, METHOD OF LOADING A SUBSTRATE, LITHOGRAPHIC APPARATUS AND DEVICE MANUFACTURING METHOD

This application is a continuation of U.S. patent application Ser. No. 15/513,086, which was filed on Mar. 21, 2017, now allowed, which is the U.S. national phase entry of PCT patent application no. PCT/EP2015/073112, which was filed on Oct. 7, 2015, which claims the benefit of priority of European patent application no, 14190079.5, which was filed on Oct. 23, 2014, each of the foregoing applications is incorporated herein in its entirety by reference.

FIELD

The present description relates to a support table for a lithographic apparatus, a method of loading a substrate, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion lithographic apparatus, immersion fluid is handled by a fluid handling system or apparatus. In an embodiment the fluid handling system or apparatus may supply immersion fluid and therefore comprise or consist of a fluid supply system or apparatus. In an embodiment the fluid handling system or apparatus may at least partly confine immersion fluid. In an embodiment the fluid handling system or apparatus may provide a barrier to immersion fluid and thereby comprise or consist of a barrier member, such as a fluid confinement structure. In an embodiment the fluid handling system or apparatus may create or use a flow of gas, for example to help in controlling the flow and/or the position of the immersion fluid. The flow of gas may form a seal to confine the immersion fluid so the fluid handling system or apparatus may be referred to as a seal member; such a seal member may be a fluid confinement structure. In an embodiment, immersion liquid is used as the immersion fluid. In that case the fluid handling system or apparatus may be a liquid handling system or apparatus. In the following description, reference to a feature defined with respect to fluid may be understood to include a feature defined with respect to liquid.

The substrate may be supported by a support table during a lithographic process. A substrate handler may be provided for transferring the substrate to and/or from the support table. A vacuum clamping system may be used to clamp the substrate to the support table. In one arrangement, the substrate may be transferred from the substrate handler onto support pins. The support pins are configured to descend slowly until the substrate is transferred from the support pins onto the support table. The substrate may be transferred from the support pins onto burls protruding from a base surface of the support table, for example. The support pins are sometimes referred to as E-pins. While the substrate is being lowered onto the support pins, gas may be pumped away from a region beneath the substrate. This pumping away of gas may create a partial vacuum beneath the substrate. A non-uniform pressure profile may build up as the substrate approaches the support table. The non-uniform pressure profile may cause internal stresses to be imparted to the substrate. When the substrate is brought into contact with the support table, a partial seal is created and the pressure beneath the substrate falls quickly. The rapidly falling pressure results in the substrate being clamped quickly and firmly to the support table. Once clamped, subsequent movement of the substrate is restricted. Internal stresses existing in the substrate prior to clamping may persist after clamping and cause subsequent deformation of the substrate.

Clamping of substrates with internal stresses may lead to overlay error. It is estimated that the internal stresses may typically contribute about 1 nm of overlay error for substrates that are initially flat. The internal stresses will tend to contribute even more overlay error for substrates that are not initially flat.

For substrates that are initially flat the internal stresses will tend to cause deformation of the substrates after clamping. For substrates which are initially non-flat the internal stresses will tend to cause an increase in the deformation after clamping. The overlay error will tend to be larger for the substrates that are initially non-flat because both the initial non-flatness and the non-uniform pressure induced stresses will tend to contribute cumulatively to a larger overall deformation after clamping.

It is therefore desirable, for example, to alleviate one or more of the aforementioned problems or one or more other problems, by reducing the extent to which substrates are deformed after they have been loaded onto the support table.

SUMMARY

According to an aspect, there is provided a support table for a lithographic apparatus, the support table configured to support a substrate, wherein the support table comprises: a base surface, the base surface facing a bottom surface of the substrate when the substrate is supported by the support table; and one or more gas cushion members above the base surface, each of the gas cushion members comprising a recess, the recess being shaped and configured such that a lowering of the substrate into a position on the support table at which the substrate is supported by the support table causes a localised build-up of pressure within the recess, the localised build-up of pressure providing a localised gas cushioning effect during the lowering of the substrate.

According to an aspect, there is provided a support table for a lithographic apparatus, the support table configured to support a substrate, wherein the support table comprises: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the respective distal ends of the plurality of burls, the respective distal end of the protrusion is spaced apart from the substrate; and one or more gas cushion members, each gas cushion member comprising a gas supply channel formed in one of the plurality of protrusions, the gas supply channel being configured to allow a flow of gas to be supplied through the support table and the protrusion to an opening in the distal end of the protrusion.

According to an aspect, there is provided a method of loading a substrate onto a support table in a lithographic apparatus, wherein the support table is configured to support a substrate, the method comprising: providing the support table, wherein the support table comprises: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the support table, the distal end is spaced apart from the substrate; and one or more gas cushion members formed in one or more of the plurality of protrusions, each gas cushion member comprising an opening configured to face towards the substrate, when the substrate is being lowered onto the support table, and a gas supply channel leading to the opening through the support table, wherein: the method further comprises providing a flow of gas through the gas supply channel to the opening or openings while the substrate is being lowered onto the support table.

According to an aspect, there is provided a device manufacturing method, comprising using a lithographic apparatus to transfer a pattern from a patterning device to a substrate, wherein the lithographic apparatus comprises a support table configured to support a substrate, the support table comprising: one or more gas cushion members, each of the gas cushion members comprising a recess, the recess being shaped and configured such that a lowering of the substrate into a position on the support table at which the substrate is supported by the support table causes a localised build-up of pressure within the recess, the localised build-up of pressure providing a localised gas cushioning effect during the lowering of the substrate.

According to an aspect, there is provided a device manufacturing method, comprising using a lithographic apparatus to transfer a pattern from a patterning device to a substrate, wherein the lithographic apparatus comprises a support table configured to support a substrate, the support table comprising: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the respective distal ends of the plurality of burls, the respective distal end of the protrusion is spaced apart from the substrate; and one or more gas cushion members, each gas cushion members comprising a gas supply channel formed in one of the plurality of protrusions, the gas supply channel being configured to allow a flow of gas to be supplied through the support table and the protrusion to an opening in the distal end of the protrusion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 is a schematic top view that depicts a gas cushion member;

FIG. 8 is a schematic side sectional view that depicts a gas cushion member comprising a gas channel;

FIG. 9 is a schematic top view that depicts a gas cushion member of the type depicted in FIG. 8;

FIG. 10 is a schematic top view that depicts a gas cushion member comprising an alternative gas channel;

DETAILED DESCRIPTION

Figure 1:
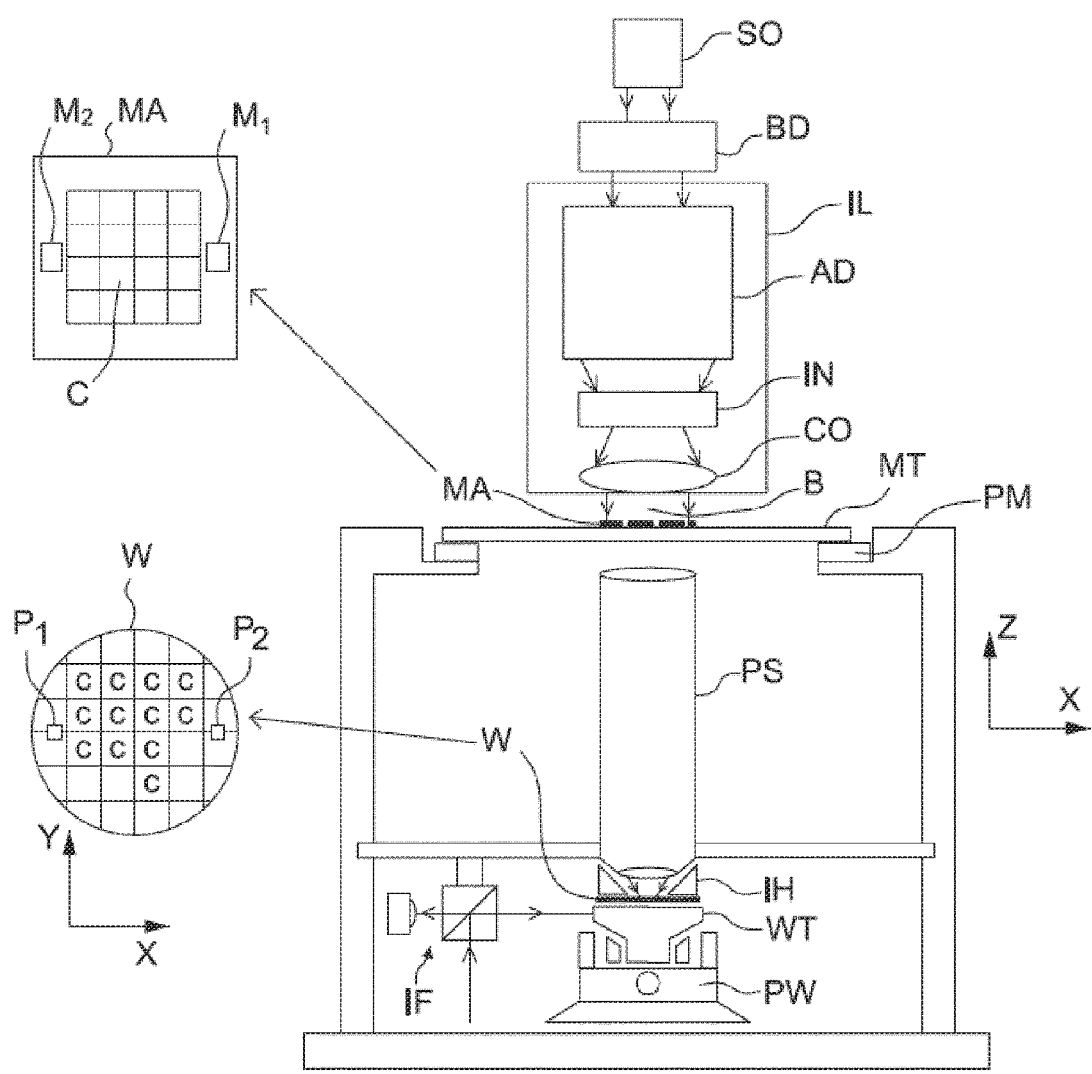
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g, UV radiation or any other suitable radiation), a support structure (e.g. a mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resistcoated wafer) W and connected to a second positioning device PW configured to accurately position the substrate W in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus and other conditions, such as whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device MA (e.g., mask), which is held on the support structure MT (e.g., mask table), and is patterned by the patterning device MA. Having traversed the mask, the radiation beam B passes through the projection system PS, which focuses the beam onto a target portion C of the substrate W. With the aid of the second positioning device PW and position sensor IF (e.g. an interferometric device, linear encoder or capacitive sensor), the support table 100 can be moved accurately, e.g. so as to position different target portions C in the path of the radiation beam B. Similarly, the first positioning device PM and another position sensor (which is not explicitly depicted in FIG. 1) can be used to accurately position the mask with respect to the path of the radiation beam B, e.g. after mechanical retrieval from a mask library, or during a scan. In general, movement of the mask table may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table may be connected to a short-stroke actuator only, or may be fixed. Mask and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask, the mask alignment marks may be located between the dies.

Arrangements for providing liquid between a final element of the projection system PS and the substrate can be classed into three general categories. These are the bath type arrangement, the so-called localised immersion system and the all-wet immersion system. In a bath type arrangement substantially the whole of the substrate W and optionally part of the substrate table WT is submersed in a bath of liquid.

Figure 2:
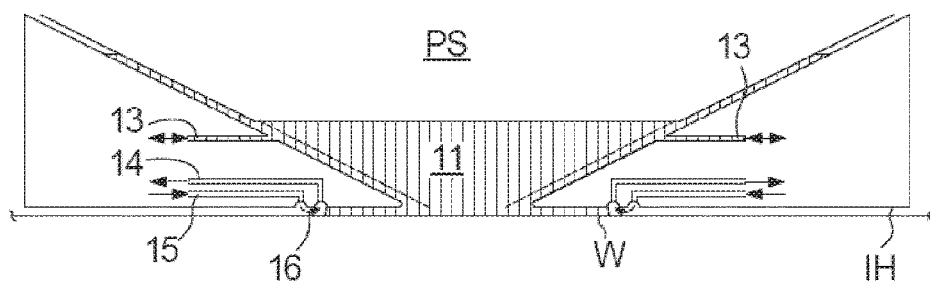
FIG. 2 depicts a liquid supply system for use in a lithographic apparatus.

An arrangement which has been proposed is to provide the liquid supply system with a liquid confinement structure which extends along at least a part of a boundary of the space between the final element of the projection system and the substrate, substrate table or both. Such an arrangement is illustrated in FIG. 2. The arrangement illustrated in FIG. 2 and described below may be applied to the lithographic apparatus described above and illustrated in FIG. 1.

FIG. 2 schematically depicts a localised liquid supply system or fluid handling system with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) In an embodiment, a seal is formed between the liquid confinement structure IH and the surface of the substrate W and which may be a contactless seal such as a gas seal 16 (such a system with a gas seal is disclosed in European patent application publication no. EP-A-1,420, 298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space 11 below the projection system PS and within the liquid confinement structure IH by opening 13. The liquid may be removed by opening 13. Whether liquid is brought into the space 11 or removed from the space 11 by the opening 13 may depend on the direction of movement of the substrate W and substrate table WT.

The liquid may be contained in the space 11 by the gas seal 16 which, during use, is formed between the bottom of the liquid confinement structure IH and the surface of the substrate W. The gas in the gas seal 16 is provided under pressure via gas inlet 15 to the gap between the liquid confinement structure IH and substrate W. The gas is extracted via a channel associated with outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal.

In a localised area liquid supply system, the substrate W is moved under the projection system PS and the liquid supply system. When, for example, an edge of the substrate W is to be imaged or when a sensor on the substrate table (or on a measurement table) is to be imaged or the substrate table WT is to be moved such that a dummy substrate or so-called closing plate can be positioned under the liquid supply system to enable, for example, substrate swap to take place, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Figure 3:
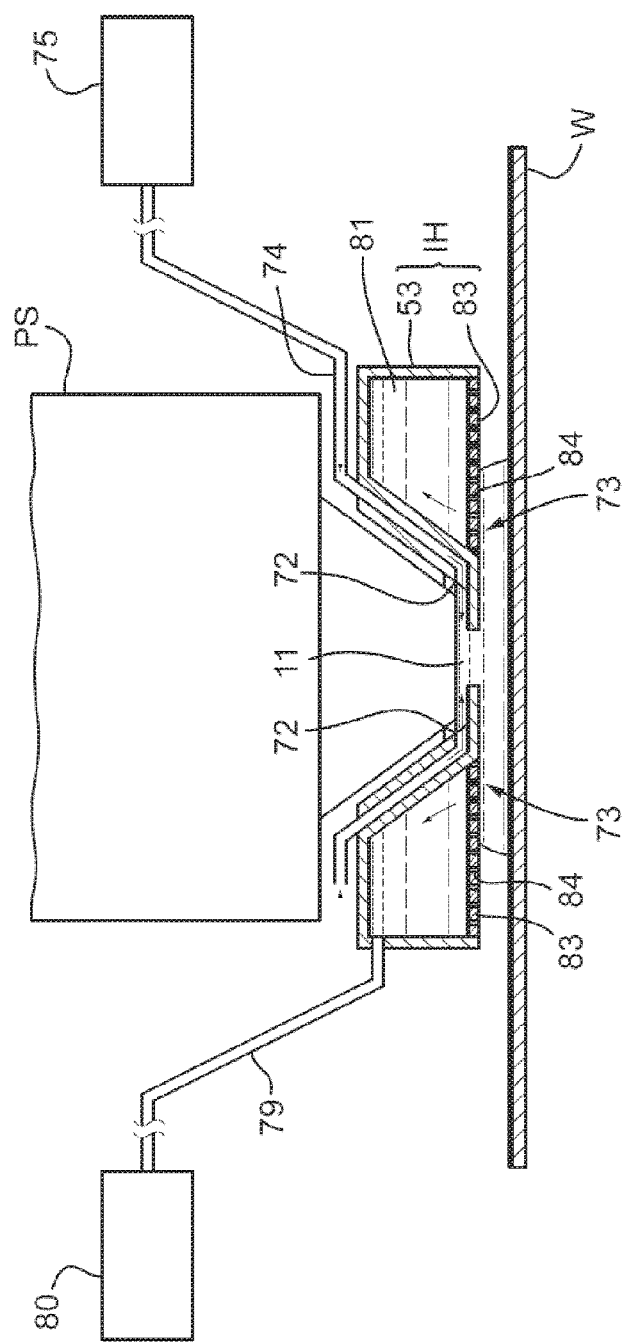
FIG. 3 is a side cross sectional view that depicts a further liquid supply system according to an embodiment.
Figure 4:
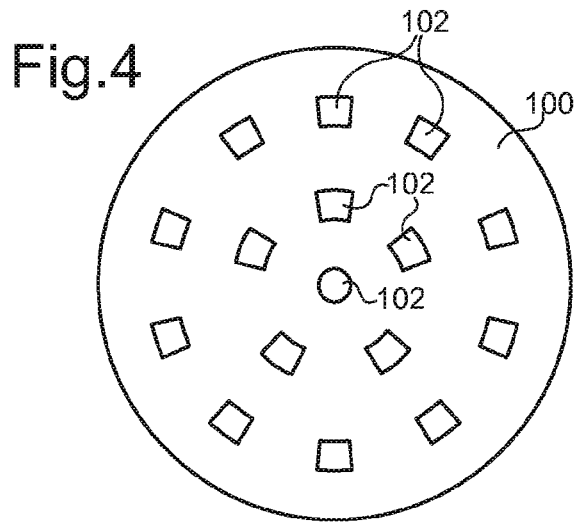
FIG. 4 is a schematic top view that depicts a support table 100 comprising a plurality of gas cushion members.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure IH, which extends along at least a part of a boundary of the space between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 with the liquid between the projection system PS and the liquid confinement structure IH on one side and the substrate W on the other side.

As described in the introductory part of the description, internal stresses generated within a substrate W during a vacuum clamping process can lead to overlay errors. Overlay errors are reduced in embodiments such as those described below, with reference to FIGS. 4-14, by providing one or more gas cushion members on a support table 100 for supporting the substrate W. The substrate table WT mentioned above with reference to FIG. 1 is an example of such a support table 100. Any of the embodiments described below may be implemented in a lithographic apparatus of the type described above with reference to any of FIGS. 1-3, as well as in other lithographic apparatus. The embodiments described may be implemented in immersion lithographic apparatus and non-immersion lithographic apparatus. In an embodiment, each of the gas cushion members is configured to apply a localized gas cushioning effect. The localized gas cushioning effect comprises the application of a localised force upwards to a localised region on an underside of the substrate W, while the substrate W is being lowered towards the gas cushion member. In an embodiment, the size of the localised force will increase as the substrate W approaches the gas cushion member. The localised force results in a localised deceleration of the substrate W. Where the substrate W is not flat, lower regions of the substrate W will tend to be decelerated more than higher regions of the substrate because the lower regions of the substrate W will tend to be nearer to the gas cushion members. The result is that the higher regions of the substrate W will tend to catch up, at least partially, with the lower regions of the substrate W prior to clamping of the substrate W. Desirably, therefore, a plurality of the gas cushion members are provided in order to allow for different gas cushioning forces to be applied at different positions beneath the substrate W. The flatness of the substrate W can therefore be improved prior to clamping, thereby improving overlay.

Alternatively or additionally, the forces applied by the gas cushion members may act to delay the clamping of the substrate W onto the support table 100. Delaying the clamping may provide more time for internal stresses within the substrate W to relax prior to clamping. Such internal stresses may be caused, for example, by a non-uniform pressure profile that may have built up beneath the substrate W during lowering of the substrate W towards the support table 100. Deformation of the substrate W due to the presence of internal stresses after clamping may therefore be reduced, thereby improving overlay. Alternatively or additionally, the improved management of internal stresses may allow the clamping force to be increased without the overlay error exceeding an acceptable amount. The efficiency of the clamping process may therefore be improved.

Specific non-limiting examples are described below with reference to FIGS. 4 to 13.

A support table 100 for a lithographic apparatus is provided. The support table 100 is configured to support a substrate W. The support table 100 comprises a base surface 101. The base surface 101 is configured to face a bottom surface 103 of the substrate W when the substrate W is supported by the support table 100. In an embodiment the base surface 101 is substantially planar. The base surface 101 may be substantially parallel to the substrate W when the substrate W is supported by the support table 100.

One or more gas cushion members 102 are provided above the base surface 101. In the particular example shown in FIG. 4, a plurality of gas cushion members 102 are provided. The number of gas cushion members 102 in this particular example is not limiting. The gas cushion members 102 may be distributed substantially uniformly over the base surface 101. In the particular example shown in FIG. 4, a single gas cushion member 102 is located at a central position and two sets of gas cushion members 102 are located at more peripheral positions. A first set of gas cushion members 102 are distributed along a circular path at a first radius from the single gas cushion member 102. In this particular example the first set of gas cushion members 102 comprises five gas cushion members 102. A second set of gas cushion members 102 are distributed along a circular path at a second radius from the single gas cushion member 102. The second radius is larger than the first radius. In this particular example the second set of gas cushion members 102 comprises ten gas cushion members 102. Thus, a total of 16 gas cushion members 102 are provided in this particular example. In other embodiments more or fewer gas cushion members 102 may be provided. Additionally or alternatively the gas cushion members 102 may be distributed differently.

In an embodiment, each of the gas cushion members 102 comprises a recess 108. The recess 108 is shaped and configured such that a lowering of the substrate W into a position on the support table 100 at which the substrate W is supported by the substrate WT causes a localised build up of pressure within the recess 108. The localized buildup of pressure in the recess 108 arises due to compression of gas within the recess 108 caused by the descending substrate W. The localized buildup of pressure provides a localised gas cushioning effect during the lowering of the substrate W. The gas cushioning effect comprises the application of a localised force to a localised region of the substrate W. The size and shape of the gas cushioning effect will typically depend on various factors, including one or more of the following: the geometry of the gas cushion member 102, the geometry of the recess 108, the position of the substrate W, the speed of movement of the substrate W, the nominal pressure of gas underneath the substrate W, and details of preceding movements of the substrate W. An important factor will be how much space is available, for example between a distal end of the gas cushion member 102 and the substrate W, for gas to escape from the recess 108 as the substrate W is lowered. The larger this space the more quickly gas can escape from the recess 108, which will tend to limit the extent to which gas is compressed. Limiting the extent to which gas is compressed will limit the pressure rise in the recess 108. Conversely, the smaller the space the less quickly gas can escape from the recess 108, which will tend to lead to greater compression of the gas and a larger pressure rise in the recess 108.

Figure 5:
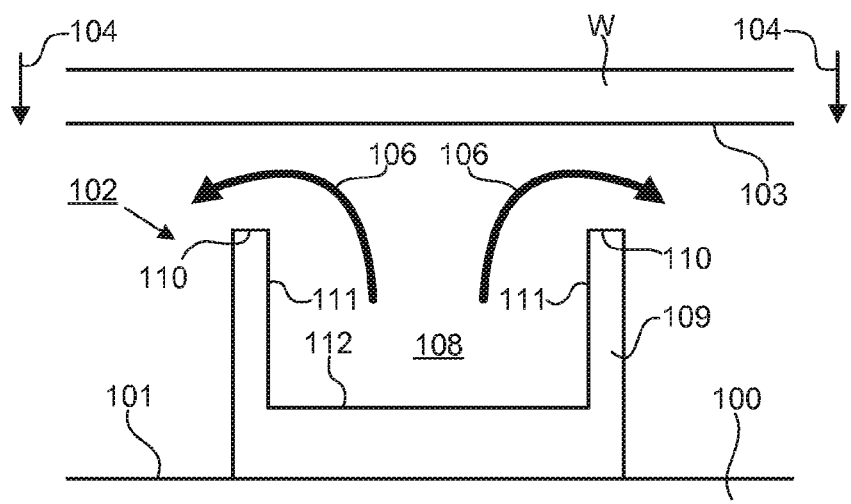
FIG. 5 is a schematic side sectional view that depicts a single gas cushion member while a substrate being lowered towards the gas cushion member.

The principle of operation of an example gas cushion member 102 is illustrated schematically in FIG. 5. In FIG. 5, arrows 104 indicate lowering of the substrate W towards the gas cushion member 102 below. In this embodiment, the gas cushion member 102 comprises a recess 108 having an inner surface defined by lateral walls 111 and a base 112. The lateral walls 111 may be cylindrical for example, or may take other shapes. The recess 108 acts to constrain gas flow (e.g.

by restricting flow in one or more lateral directions) while the substrate W is descending in such a way that gas within the recess 108 is compressed. As discussed above, the compression may be limited by some gas being able to escape from the recess 108 (illustrated by arrows 106). The rate at which gas can escape will depend on the size of a gap between the distal rim 110 of the recess 108 and the descending substrate W. A smaller gap will provide a larger flow resistance to the flow 106, which will reduce the amount of gas that can escape. As the descending substrate W gets closer to the distal rim 110 the gap available for the flow 106 gets smaller and the flow resistance gets higher. In embodiments of this type it is expected that the flow resistance will vary approximately as $(1/\text{gap size})^3$. The pressure within the recess 108 will therefore tend to be higher at lower positions of the substrate W. The gas cushion member 102 therefore provides a localised gas cushioning effect which increases in strength as the substrate W gets closer to the support table 100 and gas cushion member 102.

Figure 14:
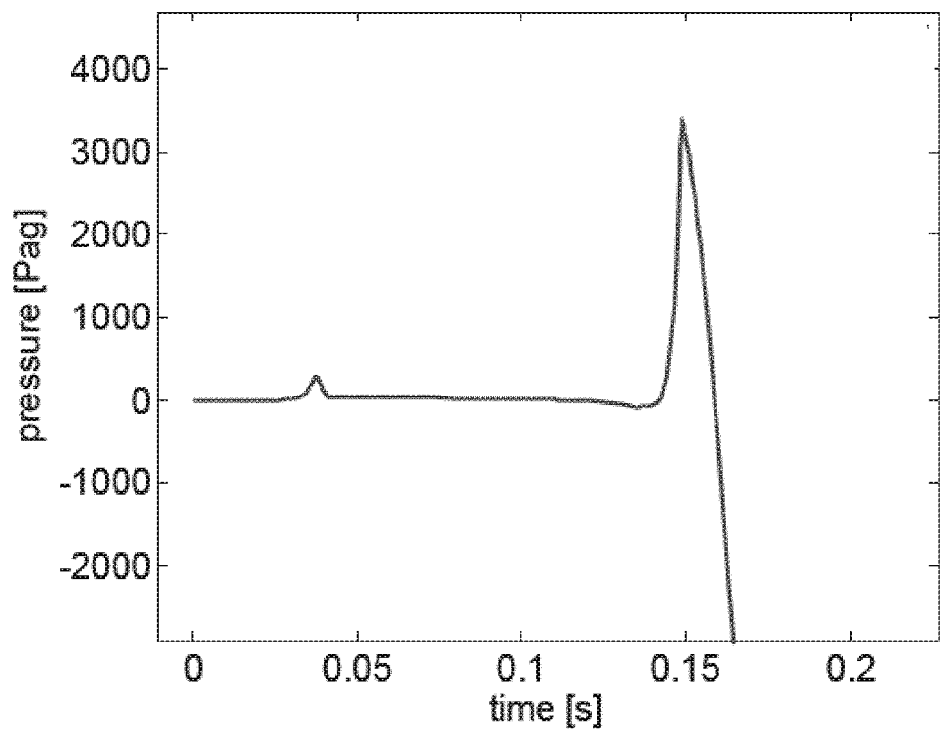
FIG. 14 depicts a graph showing a simulated variation of pressure with time in a gas cushion member during loading of a substrate.

The variation of pressure with time in a gas cushion member 102 during loading of a substrate W will depend strongly on the shape and dimensions of the recess 108. As a non-limiting example, FIG. 14 shows the results of simulations showing how pressure is expected to vary in a single 20 mm diameter gas cushion member 102 positioned beneath a substrate W descending under gravity. The gas cushion member 102 in this example is formed from a hollow cylindrical wall which is closed at one end and open at the other end. The thickness of the wall is 0.5 mm. The height of the cylinder is 3 microns lower than the height of burls which will support the substrate W when the substrate W is brought into contact with the support table 100. In FIG. 14, the substrate W moves down starting from t=0. The substrate W touches the support table 100 at the moment where the pressure reaches its maximum of 3000 Pa. In comparison the gravitational pressure on the substrate W is 18 Pa. The gravitational pressure may cause a deformation of the substrate W of approximately 10 microns if supported in the substrate center or approximately 3 microns if supported on typical supporting pins (E-pins). As can be seen, for a large proportion of the lowering time the pressure remains approximately constant due to the lack of any significant constraining of gas underneath the substrate W. When the substrate W approaches the gas cushioning member 102 the pressure starts to fall as the pumping associating with the vacuum clamping process starts to be effective at lowering the pressure. However, the gas in the gas cushioning member 102 subsequently starts to be compressed and the pressure rises quickly towards the maximum of 3000 Pa. The compression then stops as the substrate W comes to rest on the burls of the support table 100. The pumping associated with the vacuum clamping process then takes over and causes the pressure to fall quickly. When the pressure falls below atmospheric pressure the substrate W becomes clamped to the support table 100.

Figure 6:
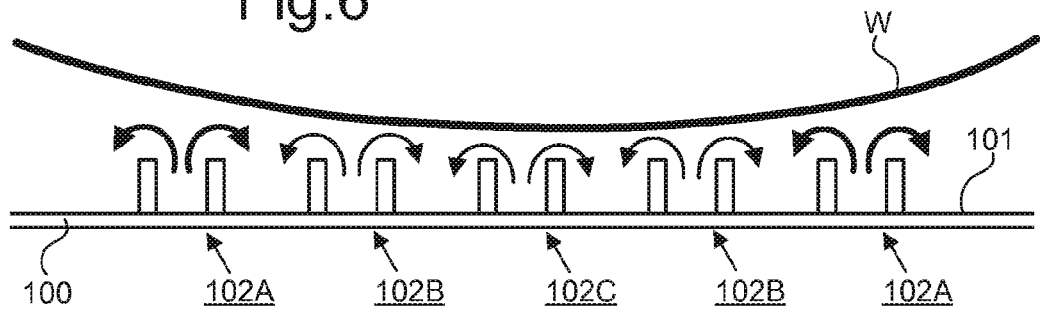
FIG. 6 is a schematic side sectional view that depicts a plurality of example gas cushion members while a substrate is being lowered towards the gas cushion members.

FIG. 6 illustrates an embodiment in which a plurality of gas cushion members 102A-C of the type shown in FIG. 5 act on a non-flat descending substrate W (the non-flatness shown is exaggerated and simplified relative to non-flatness that is likely to be encountered in practice, for illustrative purposes). The non-flatness may be caused by various factors. For example, gravity acting on a substrate W that is not uniformly supported over all of the bottom surface 103 may cause non-flatness. Gravity acting on a substrate W supported by supporting pins (E-pins) may cause non-flatness. In the illustrative example shown, at the instant in time depicted in FIG. 6 the substrate W is lower in a central region than in peripheral regions due to the non-flatness. As a result, the substrate W is closer to the central gas cushion member 102C than to the gas cushion members 102B and 102A. The gas cushioning effect applied by the gas cushion member 102C is therefore stronger than the gas cushioning effect applied by the gas cushion members 102B. The gas cushioning effect provided by the gas cushion members 102B is also stronger than the gas cushioning effect provided by the gas cushion members 102A. The central region of the substrate W will therefore tend to be decelerated to a greater extent than the more lateral regions of the substrate W. Lateral regions of the substrate W will therefore tend to catch up with regions that are more central, thereby flattening the substrate W and reducing overlay error.

Figure 11:
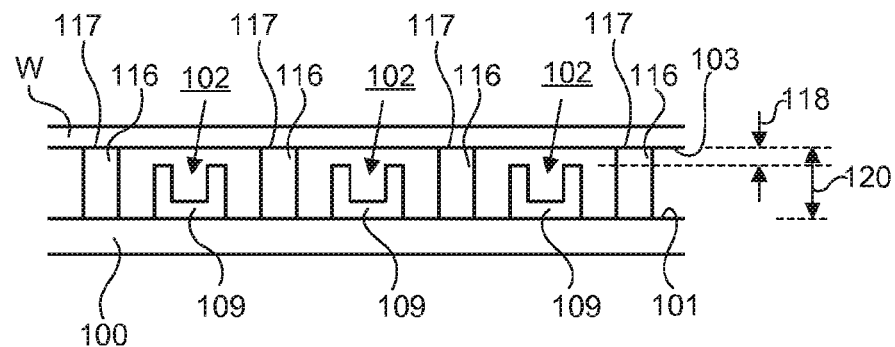
FIG. 11 is a schematic side sectional view that depicts a portion of a support table comprising a plurality of burls supporting a substrate and a plurality of gas cushion members formed in protrusions that are lower than the burls.

In an embodiment one or more of the gas cushion members 102 is formed in a protrusion 109. The support table 100 may comprise a plurality of the protrusions 109. In an embodiment, each of the protrusions 109 comprises a single gas cushion member 102 (e.g, each of the protrusions 109 comprises a single recess 108). In other embodiments, one or more of the protrusions 109 may each comprise more than one gas cushion member 102 (e.g. each of one or more of the protrusions 109 comprises plural recesses 108). Providing gas cushion members 102 in the protrusions 109 makes it possible to bring a distal rim 110 defining the recess 108 closer to the substrate W. Bringing the distal rim 110 closer to the substrate W increases the flow resistance for gas escaping from the recess 108. Increasing the flow resistance for gas escaping from the recess 108 will tend to increase compression of the gas and lead to a higher pressure within the recess 108. Each protrusion 109 protrudes above the base surface 101 of the support table 100. The protrusions 109 may not be the only features which protrude above the base surface 101 of the support table 100. Each protrusion 109 has a distal end. The distal end of the protrusion 109 is the portion of the protrusion which is furthest from the portion of the base surface 101 from which the protrusion 109 protrudes. In the case where the base surface 101 is substantially horizontal the distal end of each protrusion 109 will be the highest portion of the protrusion 109. In an embodiment, the protrusions 109 are configured such that, when the substrate W is supported by the support table 100, the distal end of each protrusion 109 is spaced apart from the substrate W. Thus, no portion of any of the protrusions 109 is in contact with the substrate W when the substrate W is supported by the support table 100. An example embodiment of this type is shown in FIG. 11, for example. In an embodiment each of one or more of the protrusions 109 may comprise one or more gas cushion members 102 in a distal end of the protrusion 109. In an embodiment, the recess 108 of a gas cushion member 102 opens out at a distal end of the protrusion 109. In the case where there is more than one opening into the recess 108, the largest opening may be configured to face towards the substrate W.

In an embodiment, the inner surface of the recess 108 may be considered as consisting of a plurality of portions and each of the portions of the inner surface is level with or above a portion of the base surface 101 that is directly adjacent to the gas cushion member 102. In the example of FIG. 5, all of the inner surface of the recess 108 is above the base surface 101. In other embodiments, the base of the recess 108 may be formed by a portion of the base surface 101 or be level with a portion of the base surface 101. In such an embodiment, the gas cushion member 102 may be formed by enclosing a portion of the base surface 101 with a wall formed in a closed loop. Examples of gas cushion members 102 of this type are shown in FIG. 6 for example.

The provision of protrusions 109 that are separate from burls 116 may also help to improve the thermal coupling between the support table 100 and the substrate W, thereby improving overlay.

In an embodiment, the support table 100 further comprises a plurality of burls 116. An example of such an embodiment is shown in FIG. 11 for example. Each of the plurality of burls 116 protrudes above the base surface 101 of the support table 100. Each of the plurality of burls 116 has a respective distal end 117. The plurality of burls 116 is arranged such that, when the substrate W is supported by the support table 100, the substrate W is supported by the respective distal ends 117 of the plurality of burls 116. In an embodiment a separation 118 between the substrate W and the distal end of at least one of the protrusions 109 is less than 10% of the height 120 of one or more of the burls 116 (when the substrate W is supported by the support table 100), optionally less than 8%, optionally less than 6%, optionally less than 4%, optionally less than 2%, optionally less than 1%, optionally less than 0.1%. Arranging for the distal ends of the protrusions 109 to be close to the substrate W ensures that the flow resistance for gas escaping from the recesses 108 is relatively high, which facilitates compression of gas within the recesses 108.

In an embodiment, one or more of the burls 116 may be provided inside one or more of the recesses 108 formed within the protrusions 109. In other embodiments all of the burls 116 may be provided outside of all of the recesses 108 formed within the protrusions 109.

Figure 12:
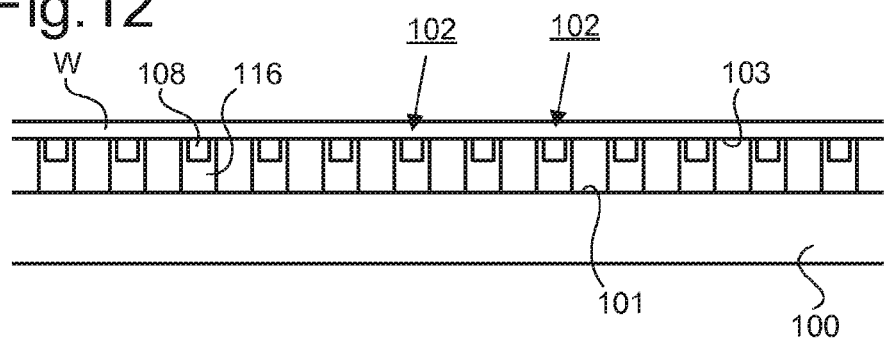
FIG. 12 is a schematic side sectional view that depicts a portion of a support table comprising a plurality of burls with gas cushion members formed in the burls.

In an embodiment, the support table 100 comprises a plurality of the burls 116 and at least one of the gas cushion members 102 is formed in one or more of the burls 116. An example of such an embodiment is shown in FIG. 12. In such an embodiment, protrusions 109 which are lower than the burls 116 may or may not be present. Where protrusions 109 which are lower than the burls 116 are provided, the protrusions 109 may or may not also comprise one or more of the gas cushion members 102.

In embodiments where gas cushion members 102 comprise recesses 108 formed in the burls 116 the gas cushioning pressure in the recesses 108 will tend to rise to a higher value as the substrate W approaches the burls 116, in comparison to the pressure in recesses 108 formed in protrusions 109 that are lower than the burls 116. However, the pressure in the recesses 108 in the burls 116 will typically act over a smaller area than the pressure in the recesses 108 in the protrusions 109. This is because the burls 116 will typically need to be smaller in order to function effectively as burls 116 (e.g. to provide a small enough total surface area in contact with the substrate W that the probability of contaminant particles being present between the burls and the substrate W, thereby causing non-flatness, is acceptably low).

In an embodiment, the recess 108 is defined by a lateral wall 111 that forms a closed loop when viewed vertically (e.g. in a direction perpendicular to a plane of the substrate W when the substrate W is supported by the support table 100). An example of such an arrangement is shown schematically in FIG. 7. The lateral wall 111 in a closed loop provides effective constraining of gas within the recess 108, thereby facilitating compression of the gas.

In an embodiment, the recess 108 has a single opening that faces the substrate W. The single opening may be surrounded by the distal rim 110 for example. In such an embodiment the recess 108 may be described as a blind recess. In other embodiments, one or more additional openings 115 may be provided. In an embodiment, a gas channel 114 is provided leading to one or more of the additional openings 115. The one or more additional openings 115 may open out into a portion of the recess 108 that is below the distal rim 110. The one or more additional openings 115 and gas channels 114 may allow gas to escape more quickly from the recess 108. Allowing gas to escape more quickly may alter the gas cushioning effect in a desirable way. Alternatively or additionally, allowing gas to escape more quickly may facilitate establishment of a clamping force after the substrate W is supported by the support table 100.

An example of an embodiment comprising an additional opening 115 and a gas channel 114 leading to an additional opening 115 is illustrated schematically in FIGS. 8 and 9. Various other shapes and configurations for the gas flow channel 114 may be provided. FIG. 10 depicts a top view of one particular example in which a gas channel 114 in the form of a slit is provided. The slit extends from the base surface 101 to the distal rim 110 of the gas cushion member 102 and therefore prevents the lateral wall 111 of the recess 108 from forming a closed loop. In the particular example shown the slit is oriented vertically but this is not essential.

Figure 13:
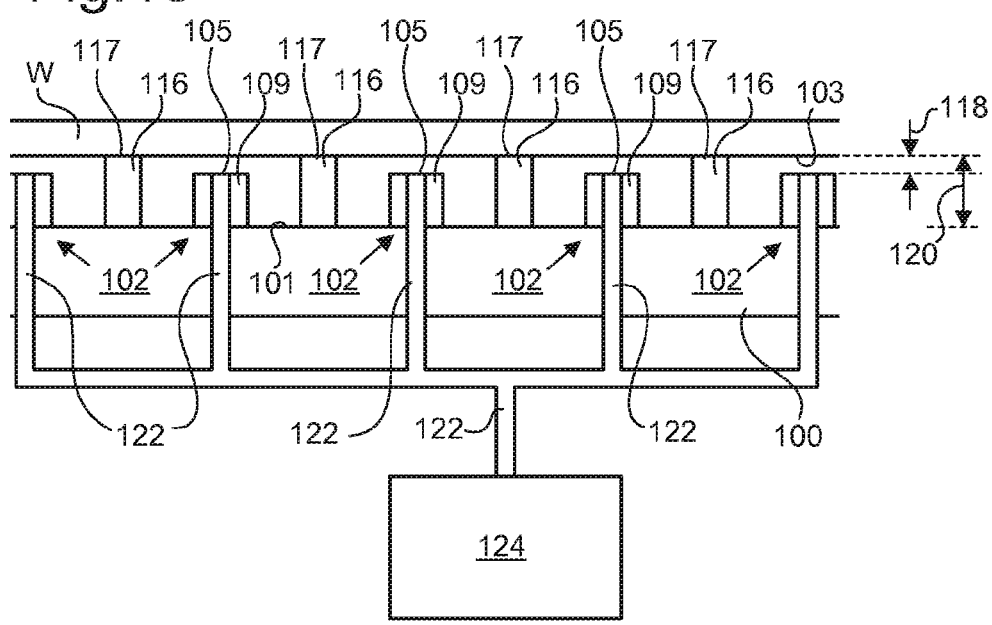
FIG. 13 is a schematic side sectional view that depicts a portion of a support table comprising a plurality of burls supporting a substrate and a plurality of gas cushion members in which gas supply channels are formed that allow a flow of gas to be supplied through the support table into protrusions that are lower than the burls.

FIG. 13 depicts an alternative embodiment in which a gas supply system 124 is provided. The gas supply system 124 is configured to drive a flow of gas through a plurality of gas cushion members 102. The gas cushion members 102 are formed in protrusions 109 in the support table 100. In embodiments of this type, a support table 100 is provided that has a base surface 101. A plurality of burls 116 is provided. The burls 116 protrude above the base surface 101. Each of the plurality of burls 116 has a respective distal end 117. The plurality of burls 116 is arranged such that, when the substrate W is supported by the support table 100, the substrate W is supported by the distal ends 117 of the plurality of burls 116. The plurality of protrusions 109 protrude above the base surface 101. Each of the plurality of protrusions 109 has a respective distal end 105. The respective distal end 105 is configured such that, when the substrate W is supported by the respective distal ends 117 of the plurality of burls 116, the respective distal end 105 of the protrusion 102 is spaced apart from the substrate W. A gas supply channel 122 is formed in one or more of the plurality of protrusions 109. In the particular embodiment shown a gas supply channel 122 is formed in each and every one of the protrusions 109, but this is not essential. Each of the gas supply channels 122 is configured to allow a flow of gas to be supplied through the support table 100 and the protrusion 109 to an opening in the distal end of the protrusion 109. In embodiments of this type, gas can therefore be supplied actively to the distal ends 105 of the protrusions 109 in order to provide a gas cushioning effect underneath the substrate W. In an embodiment a separation 118 between the substrate W and the distal end 105 of at least one of the protrusions 109 is less 10% of the height 120 of one or more of the burls 116 (when the substrate W is supported by the support table 100), optionally less than 8%, optionally less than 6%, optionally less than 4%, optionally less than 2%, optionally less than 1%, optionally less than 0.1%. Arranging for the distal ends 105 of the protrusions 109 to be close to the substrate W ensures that the flow resistance for gas escaping from the recesses 108 is relatively high, thereby facilitating the maintenance of high pressure between the gas cushion members 102 and the substrate W.

In an embodiment of the type shown in FIG. 13, a portion of the gas supply channel 122 formed in at least one of the protrusions 109 is defined by a lateral wall that forms a closed loop when viewed in a direction perpendicular to the base surface 101.

In an embodiment, a method of loading a substrate W onto a support table 100 is provided which uses a support table 100 of an embodiment of the type shown in FIG. 13. The method comprises providing such a support table 100 and providing a flow of gas through the gas supply channel 122 to the opening or openings in the protrusions 109 while the substrate W is being lowered onto the support table 100.

In an embodiment, a device manufacturing method is provided which comprises loading a substrate W onto a support table 100 according to an embodiment, and using a lithographic apparatus comprising the support table 100 to transfer a pattern from a patterning device MA to the substrate W.

In an embodiment, there is provided a support table for a lithographic apparatus, the support table configured to support a substrate, wherein the support table comprises: a base surface, the base surface facing a bottom surface of the substrate when the substrate is supported by the support table; and one or more gas cushion members above the base surface, each of the gas cushion members comprising a recess, the recess being shaped and configured such that a lowering of the substrate into a position on the support table at which the substrate is supported by the support table causes a localized build-up of pressure within the recess, the localized build-up of pressure providing a localized gas cushioning effect during the lowering of the substrate.

In an embodiment, the support table further comprises: a plurality of protrusions protruding above the base surface, each of the plurality of protrusions having a respective distal end, the respective distal end being configured such that, when the substrate is supported by the support table, the distal end is spaced apart from the substrate, wherein at least one of the gas cushion members is formed in one or more of the protrusions. In an embodiment, the support table further comprises: a plurality of burls protruding above the base surface, each of the plurality of burls having a respective distal end, the plurality of burls being arranged such that, when the substrate is supported by the support table, the substrate is supported by the respective distal ends of the plurality of burls, wherein a separation between the substrate and the distal end of at least one of the protrusions comprising the gas cushion members, when the substrate is supported by the support table, is less than 10% of a height of one or more of the burls. In an embodiment, the support table comprises: a plurality of burls protruding above the base surface, each of the plurality of burls having a respective distal end, the plurality of burls being arranged such that, when the substrate is supported by the support table, the substrate is supported by the respective distal ends of the plurality of burls, wherein at least one of the gas cushion members is formed in the distal end of one or more of the plurality of the burls. In an embodiment, the recess is defined by a wall that forms a closed loop when viewed in a direction perpendicular to the bottom surface of the substrate when the substrate is supported by the support table. In an embodiment, at least one of the recesses comprises: a distal rim defining an opening of the recess that is closest to the substrate when the substrate is supported by the support table; and a gas channel configured to open out into a portion of the recess that is below the distal rim, the gas channel being configured to allow a gas flow into or out of the recess while the substrate is being lowered onto the support table, thereby providing an adjustment of the localized gas cushioning effect provided by the recess.

In an embodiment, there is provided a support table for a lithographic apparatus, the support table configured to support a substrate, wherein the support table comprises: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the respective distal ends of the plurality of burls, the respective distal end of the protrusion is spaced apart from the substrate; and one or more gas cushion members, each gas cushion member comprising a gas supply channel formed in one of the plurality of protrusions, the gas supply channel being configured to allow a flow of gas to be supplied through the support table and the protrusion to an opening in the distal end of the protrusion.

In an embodiment, a separation between the substrate and the distal end of at least one of the protrusions comprising the gas cushion members, when the substrate is supported by the support table, is less than 10% of a height of one or more of the burls. In an embodiment, a portion of the gas supply channel formed in at least one of the protrusions is defined by a wall that forms a closed loop when viewed in a direction perpendicular to the base surface.

In an embodiment, there is provided a lithographic apparatus, comprising a support table as described herein.

In an embodiment, there is provided a method of loading a substrate onto a support table in a lithographic apparatus, wherein the support table is configured to support a substrate, the method comprising: providing the support table, wherein the support table comprises: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the support table, the distal end is spaced apart from the substrate; and one or more gas cushion members formed in the distal end of one or more of the plurality of protrusions, each gas cushion member comprising an opening configured to face towards the substrate, when the substrate is being lowered onto the support table, and a gas supply channel leading to the opening through the support table, wherein the method further comprises providing a flow of gas through the gas supply channel to the opening or openings while the substrate is being lowered onto the support table.

In an embodiment, there is provided a device manufacturing method, comprising: loading a substrate onto a support table in a lithographic apparatus using as method as described herein; and using the lithographic apparatus to transfer a pattern from a patterning device to the substrate.

In an embodiment, there is provides a device manufacturing method, comprising using a lithographic apparatus to transfer a pattern from a patterning device to a substrate, wherein the lithographic apparatus comprises a support table configured to support a substrate, the support table comprising: one or more gas cushion members, each of the gas cushion members comprising a recess, the recess being shaped and configured such that a lowering of the substrate into a position on the support table at which the substrate is supported by the support table causes a localized build-up of pressure within the recess, the localized build-up of pressure providing a localized gas cushioning effect during the lowering of the substrate.

In an embodiment, there is provided a device manufacturing method, comprising using a lithographic apparatus to transfer a pattern from a patterning device to a substrate, wherein the lithographic apparatus comprises a support table configured to support a substrate, the support table comprising: a base surface; a plurality of burls protruding above the base surface, each of the plurality of burls having a respective distal end, the plurality of burls being arranged such that, when the substrate is supported by the support table, the substrate is supported by the respective distal ends of the plurality of burls; a plurality of protrusions protruding above the base surface, each of the plurality of protrusions having a respective distal end, the respective distal end being configured such that, when the substrate is supported by the respective distal ends of the plurality of burls, the respective distal end of the protrusion is spaced apart from the substrate; and one or more gas cushion members, each gas cushion members comprising a gas supply channel formed in one of the plurality of protrusions, the gas supply channel being configured to allow a flow of gas to be supplied through the support table and the protrusion to an opening in the distal end of the protrusion.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g, having a wavelength of or about 365, 248, 193, 157, or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A support table for a lithographic apparatus, the support table configured to support a substrate, wherein the support table comprises:
   a base surface, the base surface facing a surface of the substrate when the substrate is supported by the support table;
   a plurality of burls protruding from the base surface, each of the plurality of burls having a respective distal end, the plurality of burls arranged such that, when the substrate is supported by the support table, the substrate is supported by the respective distal ends of the plurality of burls; and
   a plurality of gas cushion members, each of the gas cushion members configured to provide a localized gas cushioning effect during a moving of the substrate into a position on the support table at which the substrate is supported by the support table,
   wherein ends of the first and second gas cushion members nearest to the substrate when supported on the support table are spaced apart by a separation from the substrate when the substrate is supported on the support table, the separation being less than 10% of a height of one or more of the burls.

2. The support table of claim 1, further comprising:
   a protrusion protruding from the base surface, the protrusion having a distal end, the distal end configured such that, when the substrate is supported by the support table, the distal end is spaced apart from the substrate,
   wherein at least one gas cushion member of the plurality of gas cushion members is formed in the protrusion.

3. The support table of claim 1, wherein at least one gas cushion member of the plurality of gas cushion members comprises at least a portion of a gas channel, wherein the at least portion of the gas channel is defined by a wall that forms a closed loop when viewed in a direction perpendicular to the base surface.

4. The support table of claim 1, wherein each of the gas cushion members is connected to a common gas supply channel configured to supply gas to the gas cushion members.

5. The support table of claim 1, wherein first and second gas cushion members of the plurality of gas cushion members are respectively located on opposite sides at least one of the burls.

6. The support table of claim 1, wherein the separation is essentially the same for each of the gas cushion members.

7. A lithographic apparatus, comprising:
   a patterning system to apply a pattern to a substrate; and
   the support table of claim 1.

8. A support table for a lithographic apparatus, the support table configured to support a substrate, wherein the support table comprises:
   a base surface;
   a plurality of burls protruding from the base surface, each of the plurality of burls having a respective distal end, the plurality of burls arranged such that, when the substrate is supported by the support table, the substrate is supported by the respective distal ends of the plurality of burls;
   a plurality of protrusions protruding from the base surface, each of the plurality of protrusions having a respective distal end, the respective distal end of each protrusion configured such that, when the substrate is supported by the respective distal ends of the plurality of burls, the respective distal end of each protrusion is spaced apart from the substrate; and
   a gas channel formed in each protrusion of the plurality of protrusions, each gas channel configured to allow a flow of gas to be supplied through the respective protrusion to an opening in the distal end of the respective protrusion,
   wherein a separation between the substrate and the distal end of at least one of the protrusions, when the substrate is supported by the support table, is less than 10% of a height of one or more of the burls.

9. The support table of claim 8, wherein a portion of at least one of the gas channels is defined by a wall that forms a closed loop when viewed in a direction perpendicular to the base surface.

10. The support table of claim 8, wherein the gas channels are connected to a common gas supply channel configured to supply gas to the gas channels.

11. The support table of claim 8, wherein first and second protrusions of the plurality of protrusions are respectively located on opposite sides at least one of the burls.

12. The support table of claim 8, wherein the separation is essentially the same for each of the protrusions.

13. A lithographic apparatus, comprising:
a patterning system to apply a pattern to a substrate; and
the support table of claim 8.

14. A support table for a lithographic apparatus, the support table configured to support a substrate, wherein the support table comprises:
a base surface, the base surface facing a surface of the substrate when the substrate is supported by the support table; and
a plurality of gas cushion members, each of the gas cushion members configured to provide a localized gas cushioning effect during a moving of the substrate into a position on the support table at which the substrate is supported by the support table,
wherein a gas cushion member of the gas cushion members comprises:
an opening defined by a distal rim that is closest to the substrate when the substrate is supported by the support table; and
a gas channel in one or more walls forming the opening, the gas channel configured to open into a portion of the gas cushion member, the gas channel configured to allow a gas flow into or out of the portion of the gas cushion member while the substrate is being moved onto the support table, thereby providing an adjustment of the localized gas cushioning effect provided by the gas cushion member.

15. The support table of claim 14, further comprising a plurality of burls protruding from the base surface, each of the plurality of burls having a respective distal end, the plurality of burls arranged such that, when the substrate is supported by the support table, the substrate is supported by the respective distal ends of the plurality of burls and wherein ends of the gas cushion members nearest to the substrate when supported on the support table are spaced apart from the substrate when the substrate is supported on the support table.

16. The support table of claim 14, wherein the gas channel opens to an ambient environment around the plurality of gas cushion members.

17. The support table of claim 14, wherein the opening is of a recess formed by the one or more walls extending from the base surface, the recess shaped and configured such that the moving of the substrate causes a localized build-up of pressure within the recess, the localized build-up of pressure providing the localized gas cushioning effect during the moving of the substrate.

18. The support table of claim 14, further comprising:
a protrusion protruding from the base surface, the protrusion having a distal end, the distal end configured such that, when the substrate is supported by the support table, the distal end is spaced apart from the substrate,
wherein the opening of the gas cushion member is formed in the protrusion.

19. The support table of claim 18, further comprising a plurality of burls protruding from the base surface, each of the plurality of burls having a respective distal end, the plurality of burls arranged such that, when the substrate is supported by the support table, the substrate is supported by the respective distal ends of the plurality of burls and wherein a separation between the substrate and the distal end of the protrusion comprising the recess of the gas cushion member, when the substrate is supported by the support table, is less than 10% of a height of one or more of the burls.

20. A lithographic apparatus, comprising:
a patterning system to apply a pattern to a substrate; and
the support table of claim 14.

* * * * *